(12) United States Patent
Wang

(10) Patent No.: US 6,300,674 B1
(45) Date of Patent: Oct. 9, 2001

(54) FLAT PACKAGE FOR SEMICONDUCTOR DIODES

(75) Inventor: Bily Wang, Hsin-Chu (TW)

(73) Assignee: Harvatek Corp., Hsin-Chu (TW)

( * ) Notice: Subject to any disclaimer, the term of this patent is extended or adjusted under 35 U.S.C. 154(b) by 0 days.

(21) Appl. No.: 09/596,907

(22) Filed: Jun. 19, 2000

(51) Int. Cl.$^7$ .................................................. H01L 23/495
(52) U.S. Cl. ........................... 257/666; 257/99; 257/433; 257/735; 438/124
(58) Field of Search .............................. 257/99, 100, 433, 257/676, 735, 774, 773, 779, 782, 783, 666, 784; 438/124

(56) References Cited

U.S. PATENT DOCUMENTS

| | | | |
|---|---|---|---|
| 5,444,301 | * 8/1995 | Song et al. ............................ | 257/737 |
| 5,969,416 | * 10/1999 | Kim ...................................... | 257/692 |
| 6,114,750 | * 9/2000 | Udagawa et al. .................... | 257/666 |
| 6,130,115 | * 10/2000 | Okumura et al. .................... | 438/124 |

FOREIGN PATENT DOCUMENTS

59208756-A * 11/1984 (JP) .
2000349222-A * 12/2000 (JP) .

* cited by examiner

*Primary Examiner*—Nathan Flynn
*Assistant Examiner*—Remmon R. Fordé
(74) *Attorney, Agent, or Firm*—H. C. Lin, Patent Agent

(57) ABSTRACT

Two flat contact pads form a portion of the bottom surface of a flat package and constitute the two external connections for the diode. The diode rests on at least one the contact pads. The diode and the contact pads are covered with protective glue. If the diode has one electrode at the bottom surface, the contact pad not in contact with diode is wire bonded to the top electrode. If the diode has both electrodes at the bottom surface, the two electrodes can rest on two separate contact pads. If the diode has both electrodes on the top surface, the electrodes can be wire-bonded to the two separate contact pads. The top surface of the contact pads can be roughened or protruded to increase adhesion between the protective glue and the contact pads. The contact pads can also have tunnels at the bottom surface to increase the gluing interface between the contact pads and the glue.

9 Claims, 6 Drawing Sheets

FLAT PACKAGE FOR SEMICONDUCTOR DIODES

BACKGROUND OF THE INVENTION (1) Field of the Invention

This invention relates to semiconductor diode package, in particular to optical diodes.

(2) Brief Description of the Related Art

FIG. 1 shows a conventional dual-inline package for semiconductor diodes such as that used for light emitting diodes (LED), laser diodes (LD), photo-diodes (PD) etc. Such packages are also applicable to image sensors. The diode chip 10 has a bottom electrode 12 and a top electrode 14. These electrodes are coupled to the extensions of two pins 13 and 15 for external connections. The bottom electrode 12 is coupled to pin 13 and the top electrode 15 is coupled through a bonding wire to pin 15. T he trend today is to miniaturize the package size of a semiconductor device. The extensions of pins 13 and 15 occupy space of the package.

SUMMARY OF THE INVENTION

An object of this package is to miniaturize the dimensions of a diode package. Another object of this invention is to facilitate surface mounting the package. These objects are obtained by surface mounting a diode package as a flat package. The bottom of the flat package has two pads, which form the external connections for the diode. The bottom electrode is mounted on one of the pads and the top electrode of the diode is wire bonded to the other pad. Thus no extensions of the connection pins are used and space is saved. The package is sealed in a transparent protective glue for an optical device.

DETAILED DESCRIPTION OF THE INVENTION

Figure 1:
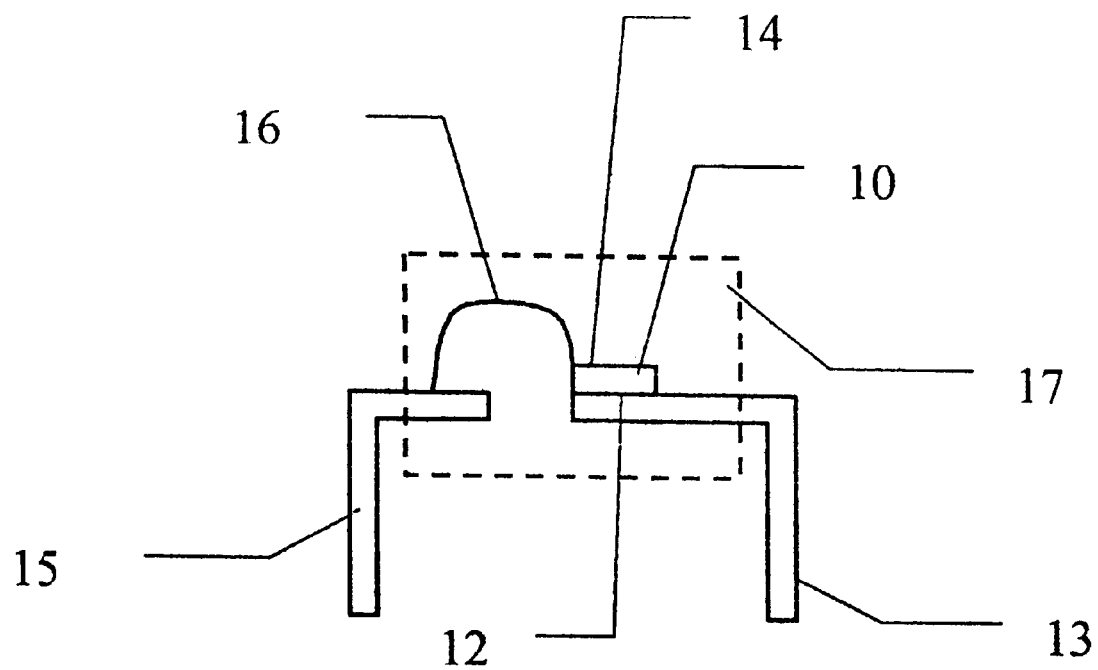
FIG. 1 shows the side view of a prior art duel inline package for a semiconductor diode.
Figure 2:
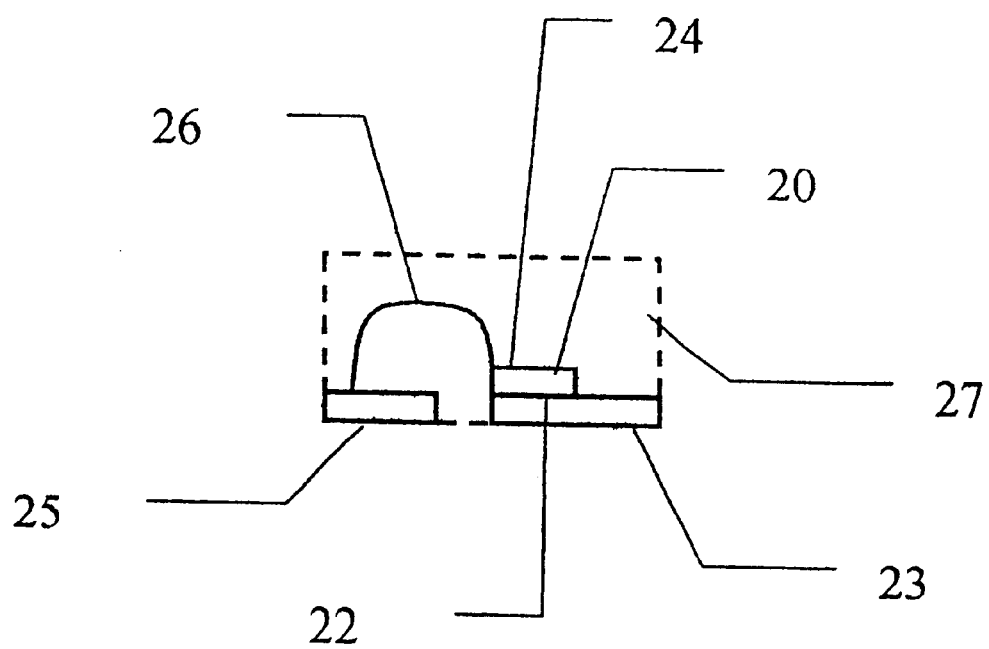
FIG. 2 shows the side view of the basic structure of the flat package of the present invention.
Figure 3:
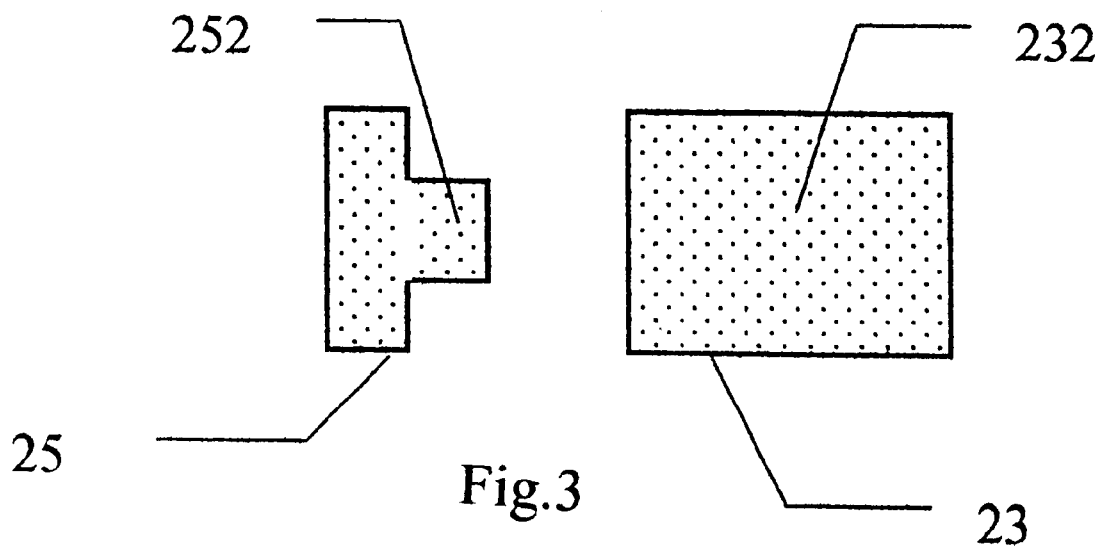
FIG. 3 shows the bottom view of the roughened surface of the contact pads.

FIG. 2 shows the side view of the basic package of the present invention. The bottom of the package has two flat contact pads 23 and 25, which can be used for surface mounting on a motherboard. A semiconductor diode 20 has a bottom electrode 22 and top electrode 24. The bottom electrode is directly mounted on top of the contact pad 23 and the top electrode of the diode 20 is wire bonded to the contact pad 25. After wire bonding, the assembly is sealed in protective glue 27. For an optical device, the protective glue is transparent. The top view of the contact pads of the package is shown in FIG. 3. The top surfaces of the contact pads 23 and 25 are roughened to increase the adhesion between the protective glue 27 and the contact pads 23 and 25 so that the protective glue 27 does not peel off from the contact pads 23 and 25.

Figure 4:
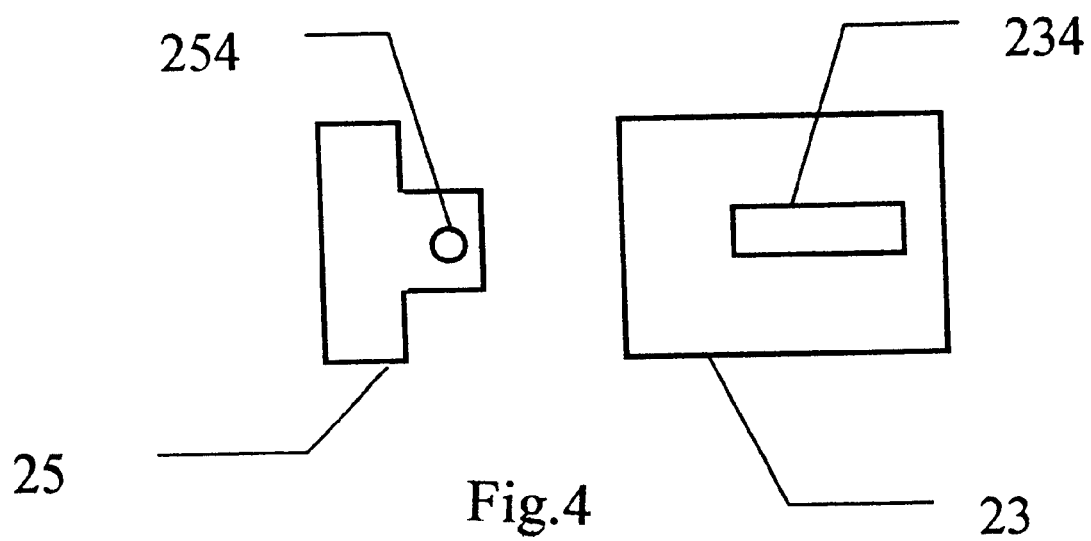
FIG. 4 shows the bottom view of the package with a hole and a slot to increase adhesion.

The adhesion can further be enhanced by cutting a hole and/or a slot in the contact pads as shown in FIG. 4. As shown, a hole 254 is cut in the contact pad 25 and a slot 234 is cut in the contact pad 23. When protective glue is poured into the hole 254 and the slot 234, the surface between the protective glue 27 and the contact pads 23 and 25 is increased so that the protective glue 27 does not peel off from the contact pads 23 and 25.

Figure 5:
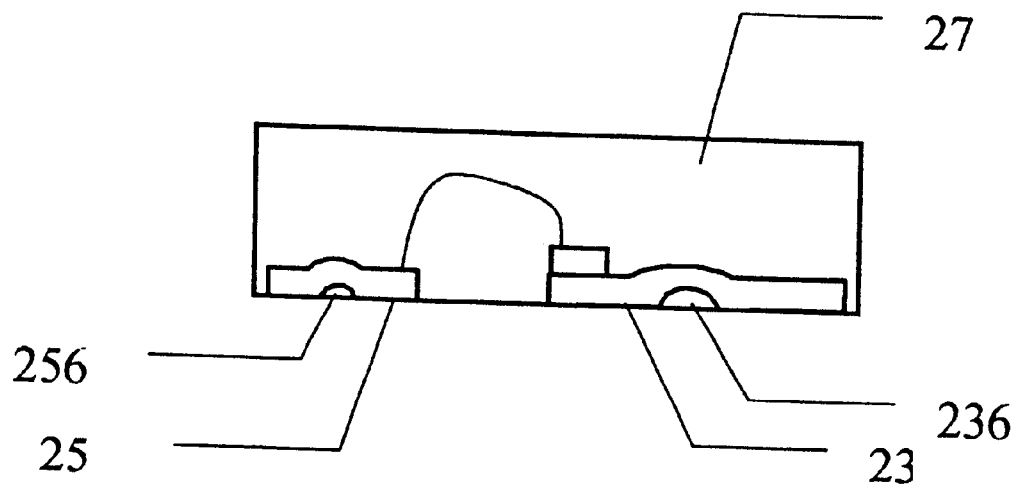
FIG. 5 shows a second embodiment of the present invention.
Figure 9:
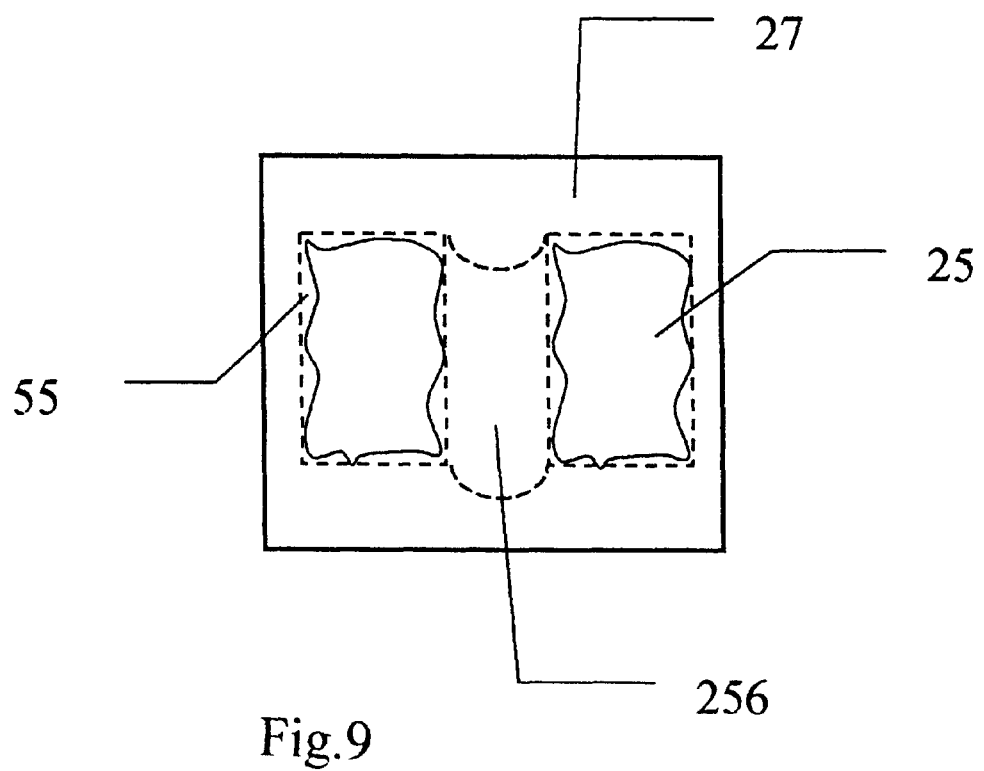
FIG. 9 shows the overflow pattern of glue at the bottom of the package.
Figure 10:
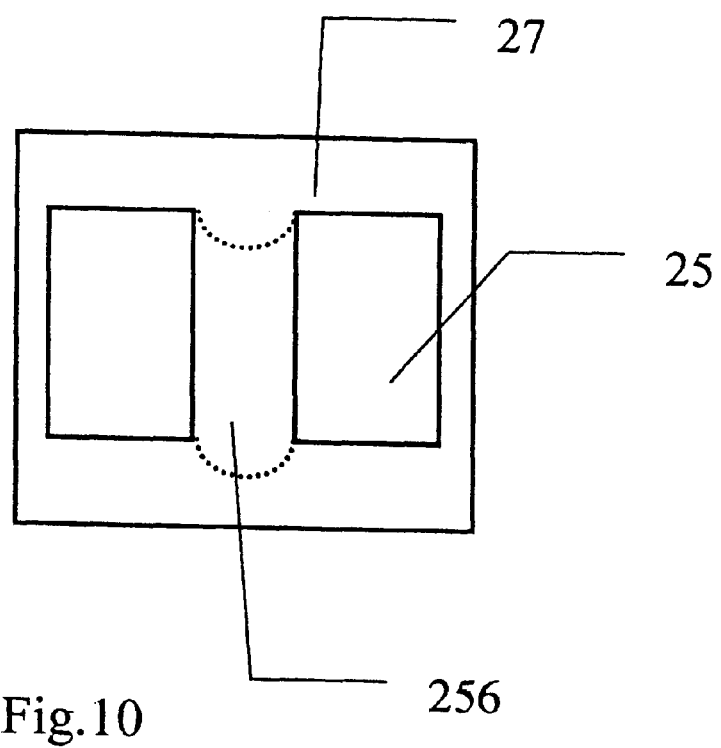
FIG. 10 shows a tunnel at the bottom of the package.
Figure 11:
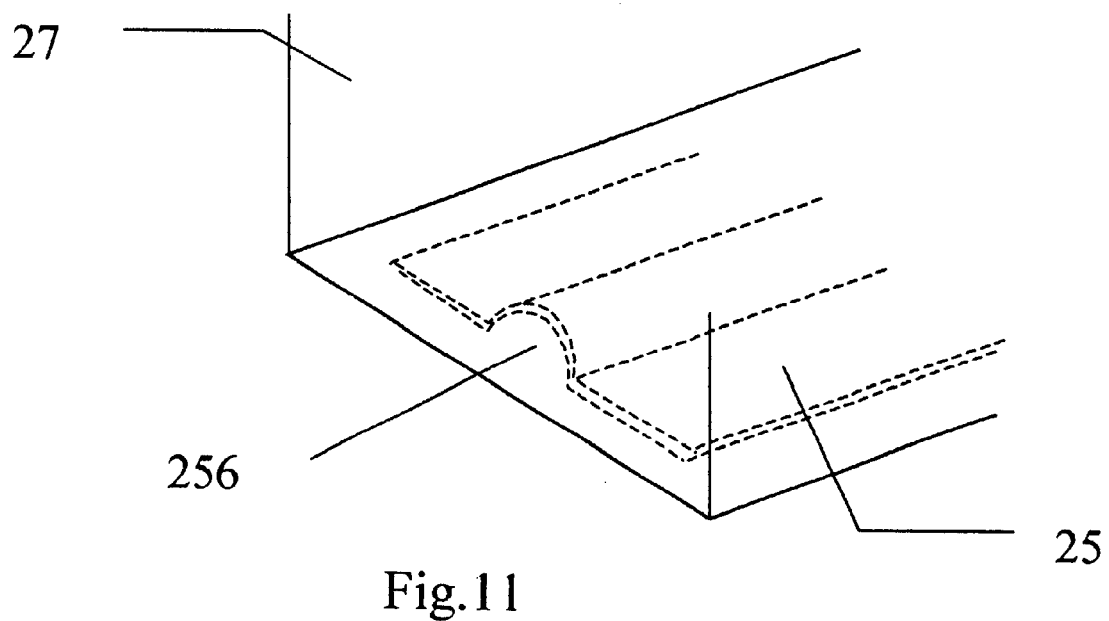
FIG. 11 shows a three-dimensional view of the tunnel shown in FIG. 10.

FIG. 5 shows another embodiment of this invention. The contact pad 23 and 25 are stamped from the bottom to produce two tunnels 236 and 256 underneath the contact pads as shown in the bottom view FIG. 10 and the 3-dimensional view in FIG. 11. During the sealing process, the glue flows into the tunnels 236 and 256 from the ends. These tunnels increase the gluing interface between the glue 27 and the contact pads 23 and 25, so that the contact pads 23 and 25 do not peel off easily from the protective glue 27. The tunnels 236 and 256 can be formed by stamping from the bottom surfaces of the respective pads. The protrusions created by the stamping process also increase the gluing interface to hold the contact pads in place. FIG. 9 shows the bottom view of the contact pads after gluing. The dotted outline 55 shows the contact pads and the solid outline shows the overflow pattern of the glue 27. The overflow 55 55 on the pad 25 can then removed for better soldering function at the pad.

Figure 6:
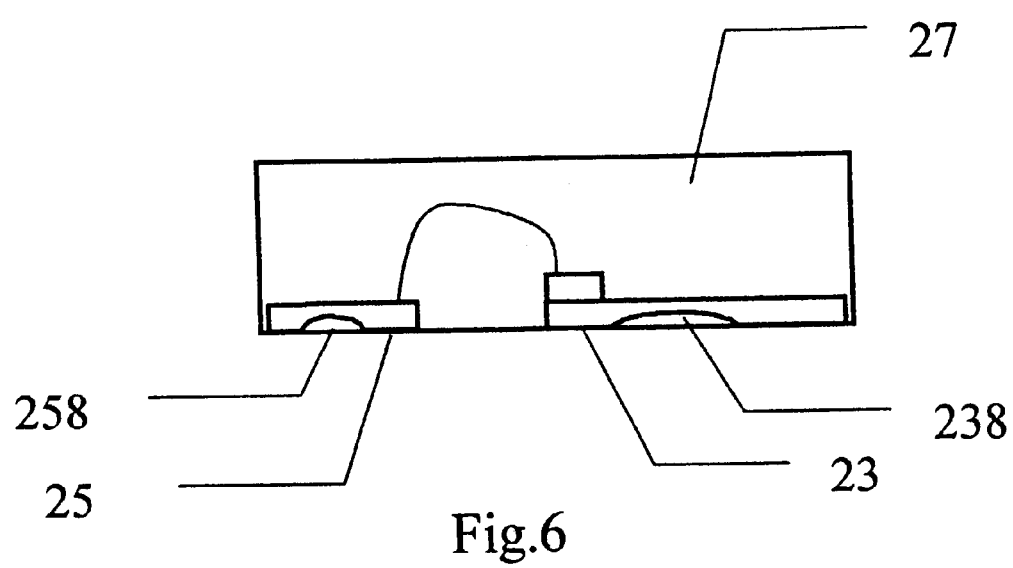
FIG. 6 shows a third embodiment of the present invention.

FIG. 6 shows still another embodiment of this invention. The contact pads are eroded or cut from the bottom to create two tunnels 238 and 285 in the contact pads 23 and 25 respectively. As in FIG. 5, these tunnels increase the adhesion between the protective glue 27 and the contact pads 23, 25. These tunnels can be formed by means of mechanical grinding, scribing or chemical etching, etc.

Figure 7:
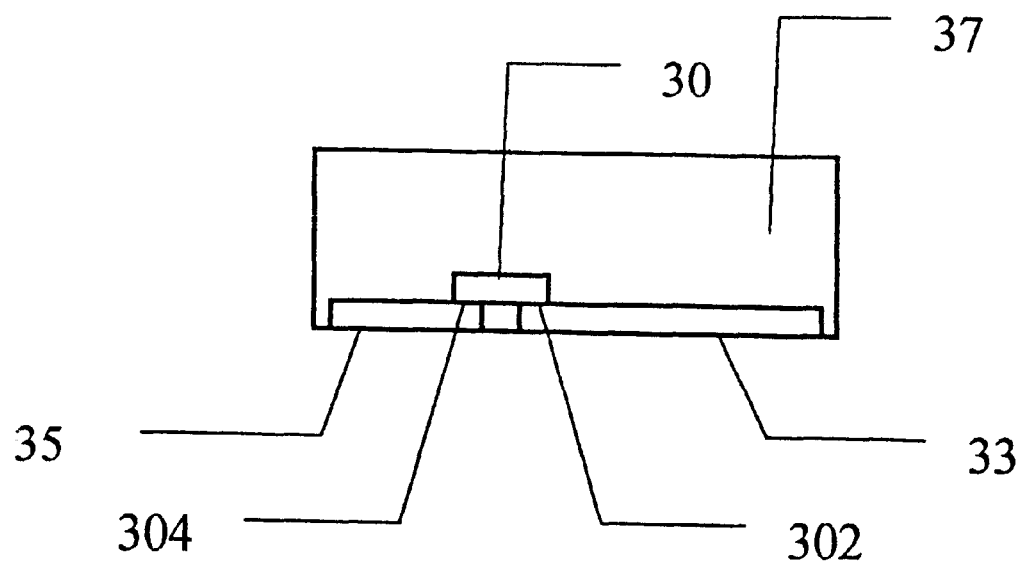
FIG. 7 shows a package for mounting a diode with two bottom electrodes.

FIG. 7 shows a flat package for mounting a diode 30 with two bottom electrodes 302 and 304. These electrodes rest on two contact pads 33 and 35 respectively at the bottom of the flat package without any bonding wires. The diode 30 and the contact pads 33 and 35 are covered with protective glue 37. The bottoms of the contact pads 33 and 35 can be coupled to a motherboard.

Figure 8:
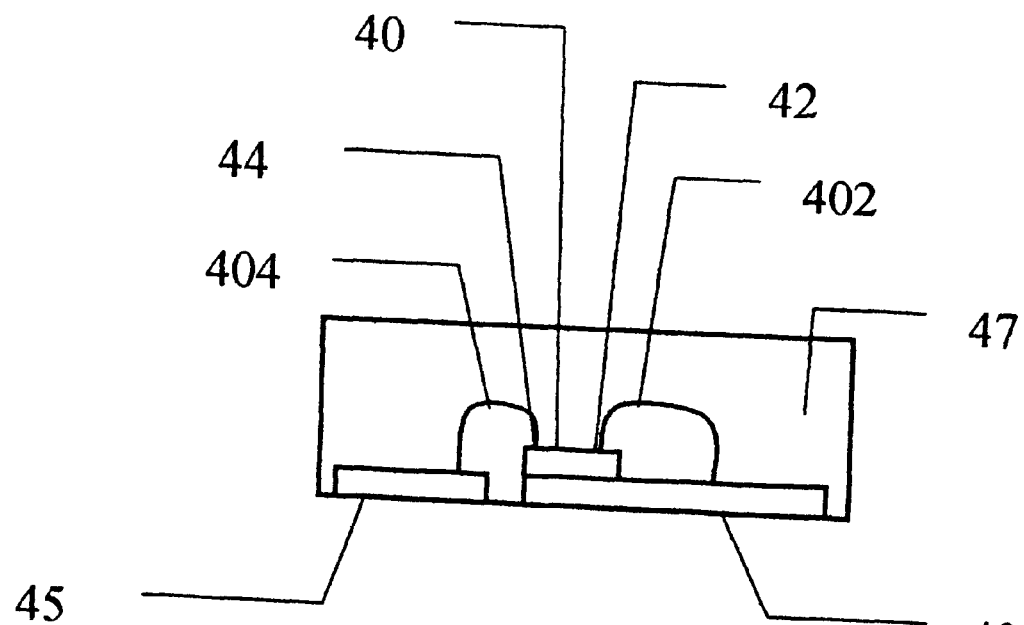
FIG. 8 shows a package for mounting a diode with two top electrodes.

FIG. 8 shows a flat package for mounting a diode 40 with two top electrodes 42 and 44. These two electrodes 42 and 44 are wire bonded to two contact pads 43 and 45 respectively. The diode 40 is mounted on the contact pad 43. The structure is then sealed in protective glue 47. The bottoms of the contact pads 43 and 45 can be coupled to a motherboard.

While the preferred embodiments of the invention have been described, it will be apparent to those skilled in the art that various modifications may be made in the embodiments without departing from the spirit of the present invention. Such modifications are all within the scope of this invention.

What is claimed is:

1. A flat package, comprising;

a semiconductor diode having a top surface and a bottom surface and two electrodes;

two contact pads for making external electrical connections with bottom surfaces planar with the bottom of said package, and having said diode mounted on at least one of said two contact pads; and a protective glue to cover said diode and said contact pads.

2. A flat package as described in claim 1, wherein the first electrode of said two electrodes is located at the bottom surface of said diode and mounted on first contact pad of said two contact pads, and the second electrode of said two electrodes is located at the top surface of said diode and wire-bonded to the second contact pad of said two contact pads.

3. A flat package as described in claim 1, wherein the top surfaces of said contact pads are roughened to increase adhesion between said protective glue and said contact pads.

4. A flat package as described in claim 1, wherein said contact pads have holes for said protective glue to adhere.

5. A flat package as described in claim 1, wherein the contact pads have protrusions at the upper surface of said contact pads to increase adhesion between said protective glue and said contact pads.

6. A flat package as described in claim 1, wherein said contact pads have depressions in the bottom surface of said contact pads to increase gluing interface between contact pads and said glue and to hold said contact pads in place.

7. A flat package as described in claim 1, wherein the two said electrodes of the diode are located at the bottom surface of said diode and make direct contact with two respective contact pads without wire-bonding.

8. A flat package as described in claim 1, wherein the two said electrodes of the diode are located at the top surface of said diode and wire-bonded to said two contact pads.

9. A flat package as described in claim 1, wherein said protective glue is transparent.

* * * * *